United States Patent [19]

Richardson

[11] 4,118,642
[45] Oct. 3, 1978

[54] HIGHER DENSITY INSULATED GATE FIELD EFFECT CIRCUIT

[75] Inventor: William Stanley Richardson, Tempe, Ariz.

[73] Assignee: Motorola, Inc., Schaumburg, Ill.

[21] Appl. No.: 765,494

[22] Filed: Feb. 4, 1977

Related U.S. Application Data

[63] Continuation of Ser. No. 590,533, Jun. 26, 1975, abandoned.

[51] Int. Cl.² .............. H03K 5/00; H01L 29/78; H01L 27/02; H01L 29/04
[52] U.S. Cl. .................. 307/238; 357/23; 357/41; 357/59
[58] Field of Search ............ 357/23, 41; 307/238

[56] References Cited

U.S. PATENT DOCUMENTS

| 3,530,443 | 9/1970 | Crafts et al. ..................... 357/41 |
| 3,588,846 | 6/1971 | Linton et al. .................... 307/238 |
| 3,610,967 | 10/1971 | Palfi ............................. 357/41 |
| 3,624,419 | 11/1971 | Kosonooky ....................... 357/41 |
| 3,694,704 | 9/1972 | Ando et al. ....................... 357/41 |
| 3,766,448 | 10/1973 | Luce et al. ....................... 357/41 |
| 3,798,621 | 3/1974 | Baitinger et al. .................. 307/238 |

OTHER PUBLICATIONS

Critchlow et al., "Design and Characteristics of N-Channel Insulated Gate Field Effect Transistors" IBM J. Res. & Develop., vol. 17 (9/73), pp. 430-442.

*Primary Examiner*—William D. Larkins
*Assistant Examiner*—Gene M. Munson
*Attorney, Agent, or Firm*—M. David Shapiro

[57] ABSTRACT

An insulated gate field effect transistor (IGFET) memory or logic circuit is implemented at higher density levels by employing thick oxide IGFET's as load elements. Additionally, the gate electrode structure of the IGFET load devices and their channel lengths with respect to the channel length of parasitic IGFET devices are selectively controlled in order to insure that the parasitic devices remain nonconductive.

6 Claims, 4 Drawing Figures

HIGHER DENSITY INSULATED GATE FIELD EFFECT CIRCUIT

This is a continuation of application Ser. No. 590,533, filed June 26, 1975, now abandoned.

BACKGROUND OF THE INVENTION

Prior art, for example U.S. Pat. No. 3,798,621, generally discloses that in an IGFET circuit some of the devices can be fabricated as thin oxide elements and certain other elements fabricated as thick oxide elements with the latter serving as load devices. This type of implementation is an advantage in that increased densities are possible. That is, when IGFETs are intended to function as a load device and they are fabricated as thin oxide devices, then their channel length must be significantly increased in order to obtain the necessary value of impedance.

Nonetheless, in the actual implementation of this approach it is found that other problems are created. Namely, it is found that even though the use of thick oxide devices as load elements permits higher densities, albeit for certain applications an additional power supply is required, the problem of creating parasitic devices still exists. As is well known, conductor lines which are employed to provide a gate voltage to IGFET devices also transverses the upper thick oxide surface of the integrated circuit. Accordingly, in many instances the gate voltage conductive line is disposed over separated regions of a first conductivity type located in a substrate of opposite conductivity type. These and other regions are not intended to function as the source and drain elements of IGFET devices, but as electrically isolated regions. However, a sufficient voltage is capable of creating a space charge which will invert the semiconductor surface layer separating these regions so as to in effect create an IGFET device, known as a parasitic device.

Therefore, it is an object of the present invention to provide an IGFET circuit, in which oxide devices are employed as load elements and in which the possibility of creating parasitic devices is minimized.

SUMMARY OF THE INVENTION

In accordance with the aforementioned object, the present invention provides an IGFET circuit implementable in integrated circuit form wherein the gate region of the thick oxide device and the gate regions of parasitic thick oxide devices both employ an insulating layer of the same thickness, but the gate electrode at the thick oxide IGFET device possesses an effective gate width less than the effective gate width of the parasitic device. Further, the channel length of the thick oxide device is smaller than the parasitic device in order to further insure that the threshold voltage for the thick oxide device is not sufficient to turn on the parasitic device.

PREFERRED EMBODIMENT

Figure 1:
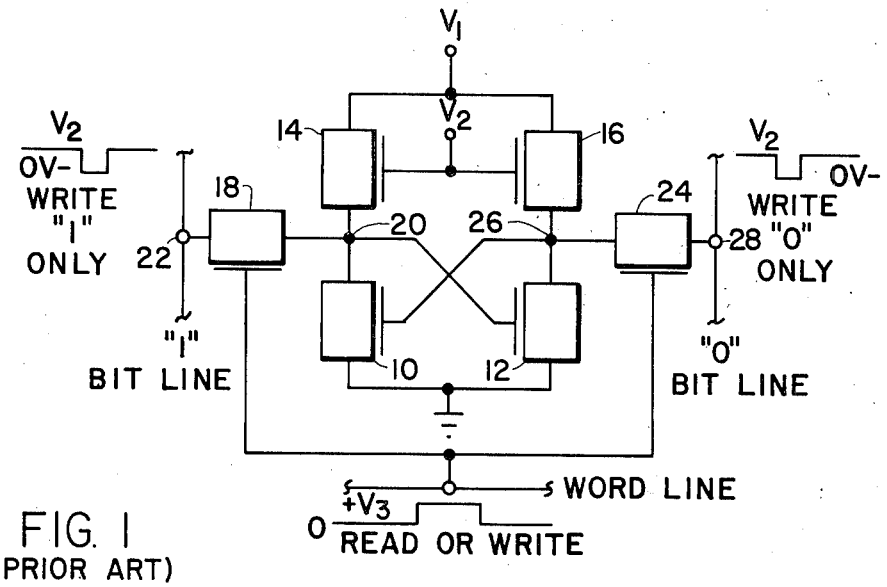
FIG. 1 is an electrical schematic diagram illustrating the use of thick oxide devices as load elements in a directly cross coupled memory cell.

FIG. 1 is an electrical schematic diagram illustrating one circuit implementation for the IGFET devices of the present invention. The source electrodes of a pair of cross-coupled IGFET devices 10 and 12 are connected to ground potential while their drain terminals are connected through separate load IGFET devices 14 and 16 to the positive supply V2. The devices 0, 12, 14 and 16 constitute a bistable Schmidt trigger circuit in which the devices 10 and 12 are the active cross coupled devices and the devices 14 and 16 are the loads for the active devices. Information is stored in the bistable trigger circuit in the form of binary "1"'s and binary "0"'s. A binary "1" is stored in the circuit when device 10 is conducting and device 12 is off and a binary "0" is stored in the circuit when device 12 is conducting and device 10 is off. For the purposes of reading or changing the information stored in the bistable trigger circuit, and IGFET device 18 couples node 20 of the trigger to the binary "1" bit-sense terminal 22 and the IGFET device 24 couples node 26 of the trigger to the binary "0" bit-sense terminal 28. The signals produced at the binary "1" and binary "0" bit-sense terminals 22 and 28 as the result of the application of a read pulse are fed into a differential amplifier (not shown) and compared to see if a binary "1" or binary "0" is stored in the cell. A potential source V1 is connected to the drains of devices 14 and 16. In this circuit implementation the potential V1 on the drains of devices 14 and 16 is lower than the potential supply V2 at least by the operating threshold of devices 14 and 16. This enables the storage cell to operate on the potential difference between V1 and ground. If the potential V1 on the drains of IGFET devices 14 and 16 were the same as the potential V2, then a much larger potential difference between V1 and ground would have to be used in order to maintain information in the storage cell during addressing.

In any event, the prior art circuit implementation of FIG. 1 merely illustrates one use for the particular IGFET devices of the present invention. Particularly, the cell of FIG. 1 in accordance with the present invention will be implemented by employing thick oxide IGFET devices as the load devices 14 and 16 and thin oxide IGFET devices for device 10, 12, 18 and 24. In this manner, a much shorter channel can be employed for load devices 14 and 16 while still achieving the desired impedance level necessary to operate the cell. Accordingly, the bistable cell is capable of being implemented in much higher densities than if thin oxide IGFET devices were employed for load devices 14 and 16. In the description of the present invention, the term IGFET device is employed in the generic sense to cover field effect transistor devices which employ an insulating layer, such as, silicon dioxide, and an overlying gate conductive gate electrode in order to induce a space charge in the gate region for creating an inversion layer in the gate region. Thus, the term IGFET devices covers metal gates as well as doped polysilicon gates, etc.

Figure 2:
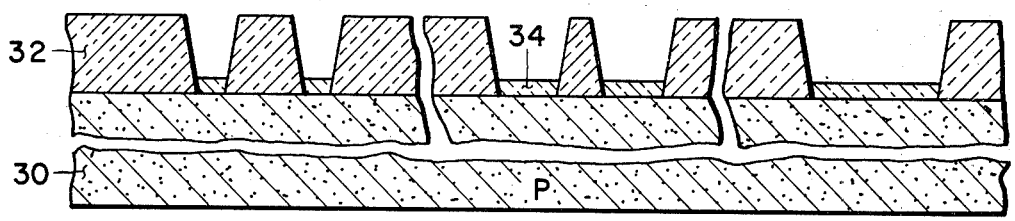
FIGS. 2-4 illustrate, in partial cross-section, the formation of a thick oxide IGFET device, a thin oxide IGFET device and a parasitic device in integrated circuit form, fabricated in accordance with the present invention.
Figure 3:
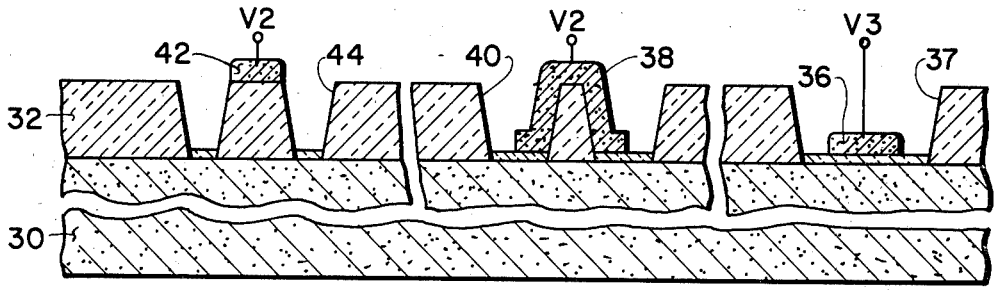
Figure 4:
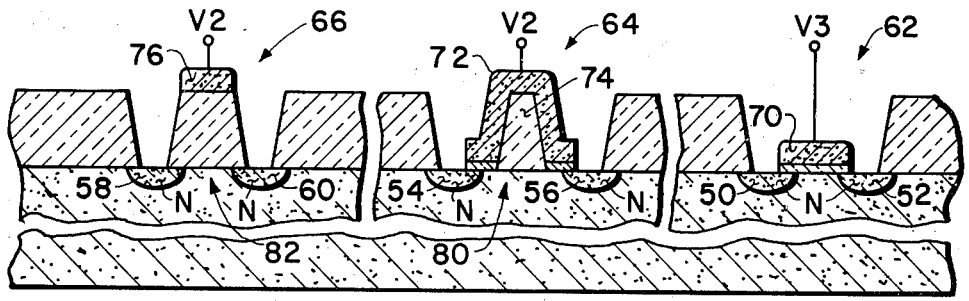

Now referring to FIGS. 2-4, they illustrate the integrated circuit fabrication of thin and thick oxide devices as well as the unintentional formation of parasitic devices for implementing IGFET circuits, such as that llustrated in FIG. 1, in accordance with the present invention. FIGS. 2-4 only show a portion of the overall integrated circuit for purposes of simplicity. However, it is to be realized that the entire circuit of FIG. 1 could be readily implemented in accordance with well known techniques once the manner of forming the thick oxide device with respect to the parasitic devices is known. Accordingly, the implementation of only a single thin oxide, thick oxide, and parasitic device is illustrated in FIGS. 2-4, hence the depiction of only three separate regions on the overall integrated circuit substrate.

The integrating circuit includes a starting 2-3 ohm-centimeter P-type substrate 30 upon which has been formed an overlying patterned $SiO_2$ or insulating layer 32 which is 8,000 to 10,000 A° thick. A thin 1,000 A° thick $SiO_2$ layer 34 is then deposited in the openings formed in the patterned layer 32. Thereafter, a mask is employed in order to deposit a polysilicon pattern approximately 3,000 A° thick over the insulative layer 32. As illustrated in FIG. 3, a polysilicon gate electrode 36 is deposited over the thin oxide layer formed in opening 37, a gate terminal 38 is deposited over the thick oxide and thin oxide regions in opening 40 and finally a polysilicon pattern 42 is deposited over the thick oxide field region disposed in opening 44.

Thereafter, the thin oxide in each of the openings 38, 40 and 44 is selectively removed and a mask employed to diffuse a plurality of N regions into the upper surface of the out substrate 30. The pair of N regions 50 and 52 constitute source and drain regions for a thin oxide IGFET device, regions 54 and 56 constitute a pair of thick oxide source and drain regions and finally regions 58 and 60 constitute a pair of isolated regions which are intended to function as electrically isolated regions, but as previously explained, may constitute or be rendered a parasitic device under certain situations. In the FIG. 4 illustration, device 62 can be employed to implement any of the thin oxide devices in the circuit of FIG. 1, such as, IGFET device 10, 12, 18 and 24. Similarly, thick oxide device 64 can be employed to implement either one of the thick oxide load devices 14 or 16. Again, device 66 becomes a parasitic IGFET.

Thus, during the formation of the active N regions in the substrate 30, the polysilicon material deposited in each of the openings 37, 40 and 44 is also converted by the N-type impurity into a conductive region. Thus, N-type region 70 comprises a gate electrode for the oxide device 62, gate region 72 overlying a thick oxide region 74, and portions of the thin oxide layer 34 constitutes a gate terminal for thick oxide device 64. The conductor line 76 identified as being disposed over regions 58 and 60 actually is deposited over the entire upper surface of the integrated circuit in order to distribute voltage V2 to all of the thick oxide gate terminals, only one of which is shown at 64. The gate terminal 72 and the conductive line 76 can be considered as a conductor means which is capable of creating an electric field density not only for the thick oxide device 64, but also at other locations in the integrated circuit. In this particular implementation the thin oxide device 62 operates at a significantly lower threshold voltage than either the thick oxide device 64 or the parasitic device 66 due to its very thin gate insulator layer and thus the conductor line 70 is connected to a separate power supply shown as V3.

Now referring to the details of the thick oxide IGFET device 64 and the thick oxide parasitic device 66, it is seen that the conductor means or gate terminal 72 disposed over the thick oxide region 74 completely envelopes its side and upper surfaces while the conductor means portion 76 also connected to the same voltage supply V2 is disposed only at the upper surface. Thus, the effective distance of the insulative or $SiO_2$ material separating gate region 80 of the thick oxide field device from gate region 82 of the parasitic device is less. That is, assuming a point intermediate between regions 54 and 56 it is seen that the application of V2 to gate electrode 72 is capable of inducing a space charge at this point, not only due to the contributions of the horizontal portion of gate electrode 72, but also due to its sidewall portions which are spaced closer to that imaginary point. On the other hand, each point at the surface of the gate region 82 associated with parasitic device 66 is a maximum distance from the conductor means 76 as determined by the thickness of the patterned layer of insulator material 32 which in the preferred embodiment is approximately 8,000 to 10,000 A° thick. Accordingly, the effective gate electrode spacing from semiconductor body 30 is less for the thick oxide device than for the parasitic device and hence in order for the parasitic to turn on a larger gate threshold voltage is required. Since V2 is connected to both the conductive regions 72 and 76 the possibilities of turning parasitic device 66 on is minimized, i.e., the surface field intensity is greater at the thick oxide device than at the parasitic device.

Additionally, further assurance that parasitic device 66 does not turn on is obtained by controlling the spacing of regions 54 and 56 with respect to the spacing of regions 58 and 60. In the preferred embodiment, the channel length of the thick oxide device 64 is 0.2 mils and the spacing of the parasitic device regions 58 and 60 is 0.3 to 0.4 mils. As a result, the depletion width caused by the penetration of the drain field towards the source region, for example, assuming region 56 to be biased as the drain and region 54 as the source and appropriate biasing levels, can be made to be substantially equal to the physical channel length or dimension. Therefore, the device 64 turns on at a lower threshold voltage as electrons, from the source 54 can be readily swept towards the drain region 56. On the other hand, by maintaining a greater spacing or channel length between regions 58 and 60, the depletion width caused by the penetration of the drain field towards the source region is of less effect in sweeping electrons towards the drain and therefore a higher threshold voltage is necessary in order to render the parasitic device conductive. This phenomena attributed to the merging of the drain depletion region with the source region provides a field in the channel region 80 which aids in turning device 64 to a conductive state. This phenomena has been previously reported in a paper authored by D. L. Critchlow, R. H. Dennard & Schuster, IBM Thomas J. Watson Research Center, Yorktown Heights, New York. However, this paper dealt strictly with the theoretical aspects of channel effect on an IGFET device, but failed to recognize the application of these observations to the problems related to parasitic devices.

What is claimed is:

1. An insulated gate field effect transistor integrated circuit comprising:
   (a) a semiconductor body of a first conductivity type including first and second pairs of distinct separated regions each pair being of opposite conductivity type to said first conductivity type and being disposed in said semiconductor body, a first surface portion of said semiconductor body located between said first pair of separated regions conducting current in response to a first surface electric field intensity applied to said first surface portion and a second surface portion of said semiconductor body being located between said second pair of separated regions;

(b) a patterned layer of insulative material disposed over said semiconductor body;

(c) a first conductor means located over said first surface portion and over said second surface portion and including means for coupling to a voltage supply of a first predetermined value, said second surface portion constituting a part of a parasitic device;

(d) said first conductor means being spaced and separated from said first surface portion of said semiconductor body by a first portion of said patterned layer of insulative material, and said first conductor means being separated and spaced from said second surface portion of semiconductor body by a second portion of said patterned layer of insulative material, said first and second portions of said patterned layer of insulative material having substantially an identical thickness; said first portion of said patterned layer of insulative material including upper and side surfaces; said first conductor means including regions disposed over said upper and side surfaces of said first portion of said patterned layer of insulative material for diminishing the effective spacing between said first portion;

(e) said second pair of separated regions being spaced apart at a predetermined distance greater than the distance between said first pair of separated regions for decreasing the field depletion width associated with said second pair of separated regions with respect to the field depletion width associated with said first pair of separated regions under biased conditions so to enable conduction of current in said first surface portion while minimizing current flow in said second surface portion; and (f) said first conductor means, said first portion of said patterned layer of insulative material, said semiconductor body and said means for coupling to a voltage supply of a first predetermined value being cooperatively responsive for generating said first surface electric field intensity at said first surface portion; said first conductor means, said second portion of said patterned layer of insulative material, said semiconductor body and said means for coupling to a voltage supply of a first predetermined value being cooperatively responsive for generating a second surface electric field intensity at said second surface portion, said second surface electric field intensity being lower than said first surface electric field intensity for minimizing the possibility of turning on the parasitic device.

2. An insulated gate field effect transistor integrated circuit as in claim 1 further comprising:

(a) a third pair of separated regions of opposite conductivity type disposed in said semiconductor body and electrically coupled to said first pair of separated regions, a third portion of said semiconductor body separating said third pair of separated regions, a third portion of said patterned layer of insulative material having a thickness less than the thickness of said first and second portions of said patterned layer of insulative material and being disposed over said third surface portion of said semiconductor body; and (b) a second conductor means isolated from said first conductor means disposed over said third portion of said patterned layer of insulative material and including means for coupling to another voltage supply having predetermined value less than the voltage supply of a first predetermined value coupled to said first conductor means.

3. An insulated gate field effect transistor integrated circuit as in claim 2 further comprising:

(a) a fourth pair of separated regions of opposite conductivity type disposed in said semiconductor body, a fourth surface portion of said semiconductor body located between said fourth pair of separated regions and conducting current in response to a fourth surface electric field intensity applied to said fourth surface portion, said first conductor means being located over said fourth surface portion;

(b) said first conductor means being spaced and separated from said fourth surface portion by a fourth portion of said patterned layer of insulative material, and said first, second, and fourth portions of said patterned layer of insulative material having substantially an identical thickness, and said first conductor means, said first, second and fourth portion of said patterned layer of insulative material, said first, second and fourth pair of separated regions and said means for coupling to a voltage supply of a first predetermined value being cooperatively responsive for generating said second surface electric field intensity of a lower magnitude than said first and fourth surface electric field intensity.

4. An insulated gate field effect transistor integrated circuit as in claim 10 further comprising:

(a) a fifth pair of separated regions of opposite conductivity type disposed in said semiconductor body and electrically coupled to said fourth pair of separated regions, a fifth portion of said semiconductor body separating said fifth pair of separated regions, a fifth portion of said patterned layer of insulative material having a thickness less than the thickness of said first, second, and fourth portions of said patterned layer of insulative material being disposed over said fifth surface portion of said semiconductor body, and said second conductor means being disposed over said fifth portion of said patterned layer of insulative material.

5. An insulated gate field effect transistor integrated circuit as in claim 4 wherein:

(a) said third and fifth pair of separated regions are electrically cross-coupled for forming a bistable storage all for storing binary information; and (b) said first and fourth pair of separated regions are electrically coupled respectively to said third and fifth pair of separated regions as load elements.

6. An integrated circuit comprising:

(a) a semiconductor body of a first conductivity type including first and second pairs of distinct separated regions each pair being of opposite conductivity type to said first conductivity type and being disposed in said semiconductor body, a first surface portion of said semiconductor body located between said first pair of separated regions conducting current in response to a first surface electric field intensity applied to said first surface portion and a second surface portion of said semiconductor body being located between said second pair of separated regions;

(b) a patterned layer of insulative material disposed over said semiconductor body;

(c) a first conductor means located over said first surface portion and over said second surface portion and including means for coupling to a voltage supply of a first predetermined value, said second surface portion constituting a part of a parasitic device;

(d) said first conductor means being spaced and separated from said first surface portion of said semiconductor body by a first portion of said patterned layer of insulative material, and said first conductor means being separated and spaced from said second surface portion of semiconductor body by a second portion of said patterned layer of insulative material, said first and second portions of said patterned layer of insulative material having substantially an identical thickness, said first portion of said patterned layer of insulative material including upper and side surfaces; said first conductor means including regions disposed over said upper and side surfaces of said first portion of said pattern layer of insulative material for diminishing the effective spacing between said first portion;

(e) said first conductor means, said first portion of said patterned layer of insulative material, said semiconductor body and said means for coupling to a voltage supply of a first predetermined value being cooperatively responsive for generating said first surface electric field intensity at said first surface portion; said first conductor means, said second portion of said patterned layer of insulative material, such semiconductor body and said means for coupling to a voltage supply of a first predetermined value being cooperatively responsive for generating a second surface electric field intensity at said second surface portion, said second surface electric field intensity being lower than said first surface electric field intensity for minimizing the possibility of turning on the parasitic device.

* * * * *